(12) United States Patent
Dunahoo et al.

(10) Patent No.: US 11,027,354 B2
(45) Date of Patent: Jun. 8, 2021

(54) MODULAR POWER CONVERSION SYSTEM AND METHOD

(71) Applicant: Illinois Tool Works Inc., Glenview, IL (US)

(72) Inventors: Jason Alan Dunahoo, Menasha, WI (US); Ronald Dewayne Woodward, Kaukauna, WI (US); Benjamin David Romenesko, Hortonville, WI (US); Chris J. Roehl, Appleton, WI (US); Craig Steven Knoener, Appleton, WI (US); Joshua Thomas Stiever, Beavercreek, OH (US)

(73) Assignee: Illinois Tool Works Inc., Glenview, IL (US)

( * ) Notice: Subject to any disclaimer, the term of this patent is extended or adjusted under 35 U.S.C. 154(b) by 574 days.

(21) Appl. No.: 13/925,395

(22) Filed: Jun. 24, 2013

(65) Prior Publication Data

US 2014/0374395 A1    Dec. 25, 2014

(51) Int. Cl.
*B23K 9/10* (2006.01)
*H05K 3/32* (2006.01)
*B23K 9/32* (2006.01)

(52) U.S. Cl.
CPC .............. *B23K 9/1006* (2013.01); *B23K 9/32* (2013.01); *H05K 3/328* (2013.01); *Y10T 29/49144* (2015.01)

(58) Field of Classification Search
CPC .. B23K 9/1043; B23K 9/1075; B23K 9/1006; H05K 7/20909; H05K 7/20918
USPC .............. 219/130.1, 137 PS, 130.21, 130.31, 219/130.32, 130.33, 130.5; 363/141, 144; 361/695, 697, 709, 714–716, 720–722, 361/724
See application file for complete search history.

(56) References Cited

U.S. PATENT DOCUMENTS

| | | | | |
|---|---|---|---|---|
| 4,772,999 A | * | 9/1988 | Fiorina | H02J 9/062 361/709 |
| 5,134,927 A | * | 8/1992 | McCarthy, III | A47J 37/047 126/21 A |
| 5,406,050 A | * | 4/1995 | Macomber | B23K 9/1068 219/130.1 |
| 5,837,968 A | | 11/1998 | Rohrberg | |

(Continued)

OTHER PUBLICATIONS

International Search Report from PCT application No. PCT/US2014/036897, dated Nov. 1, 2014, 13 pgs.

(Continued)

*Primary Examiner* — Tu B Hoang
*Assistant Examiner* — Alba T Rosario-Aponte
(74) *Attorney, Agent, or Firm* — McAndrews, Held & Malloy, Ltd.

(57) ABSTRACT

A power conversion assembly for use in a welding power supply includes a power magnetics module and a power electronics module. The power magnetics module includes at least one transformer disposed on a first wind tunnel housing. The power electronics module is separate from and electrically coupled to the power magnetics module. The power electronics module includes switching circuitry and one or more heat sinks to remove heat from the switching circuitry. The switching circuitry and the heat sinks are disposed on a second wind tunnel housing coupled to the first wind tunnel housing.

15 Claims, 6 Drawing Sheets

(56) References Cited

U.S. PATENT DOCUMENTS

| | | | |
|---|---|---|---|
| 6,489,591 B1* | 12/2002 | Achtner | B23K 9/32 |
| | | | 219/130.1 |
| 6,665,183 B1 | 12/2003 | Shikata | |
| 6,831,838 B1 | 12/2004 | Boyce | |
| 7,259,355 B2* | 8/2007 | Bender | B23K 9/1006 |
| | | | 219/133 |
| 7,455,373 B2* | 11/2008 | Bender | B23K 9/32 |
| | | | 219/133 |
| 7,868,588 B2* | 1/2011 | Altekruse | H02J 7/0042 |
| | | | 320/104 |
| 2011/0222243 A1* | 9/2011 | Nagami | B23K 9/1006 |
| | | | 361/697 |

OTHER PUBLICATIONS

U.S. Appl. No. 13/910,015, filed Jun. 4, 2013, Nathan J. Jochman.

* cited by examiner

MODULAR POWER CONVERSION SYSTEM AND METHOD

BACKGROUND

The invention relates generally to welding systems and, more particularly, to a modular power conversion system for use in a welding power supply.

Welding is a process that has become increasingly ubiquitous in various industries and applications. Welding systems generally include a power supply that employs circuitry for converting power from one useful form to another. For example, a welding power supply may use power conversion circuitry to change input AC primary power to filtered DC welding power. Some power supplies include power conversion circuitry components that allow for precisely controlled welding power output. In inverter power supplies, the power conversion circuitry includes any number of transformers, power switching circuits, and rectifiers, among other power components. In addition, the power conversion circuitry is packaged with one or more heat sinks, fans, and other thermal system components to maintain a desired temperature of the power conversion circuitry.

In conventional welding power supplies, challenges exist in appropriate packaging of the electrical components of the power conversion circuitry. Specifically, the power conversion circuitry generally includes all of the power electronics, control electronics, and power magnetics integrated within a single assembly. Unfortunately, this arrangement can be overly complex to assemble. In addition, the arrangement may not provide access to individual subcomponents of the power conversion circuitry for assembly or testing. That is, the entire power supply is generally assembled and then tested to ensure proper operation of the power conversion circuitry. If the power supply does not function properly, this can lead to expensive rework of the entire system, since it is not always clear what components of the power supply are not operating as desired.

BRIEF DESCRIPTION

In a first embodiment, power conversion assembly for use in a welding power supply includes a power magnetics module and a power electronics module. The power magnetics module includes at least one transformer disposed on a first wind tunnel housing. The power electronics module is separate from and electrically coupled to the power magnetics module. The power electronics module includes switching circuitry and one or more heat sinks to remove heat from the switching circuitry. The switching circuitry and the heat sinks are disposed on a second wind tunnel housing coupled to the first wind tunnel housing.

In another embodiment, a welding power supply includes a power conversion assembly. The power conversion assembly includes at least two separate modules coupled together to convert incoming primary power into welding power output. One of the at least two separate modules comprises a power magnetics module having a transformer. Another of the at least two separate modules comprises a power electronics module having switching circuitry.

In a further embodiment, a method for assembling a welding power supply is provided. The method includes providing a first housing of a power conversion assembly of the welding power supply. The method also includes providing power magnetics of the power conversion assembly, and disposing the power magnetics in the first housing. In addition, the method includes providing a second housing of the power conversion assembly coupled to the first housing to form a wind tunnel of the welding power supply. Further, the method includes providing power electronics of the power conversion assembly. The power electronics comprise electronic switching circuitry, control circuitry, or both. The method also includes disposing the power electronics in the second housing, and coupling the power electronics disposed on the second housing to the power magnetics disposed on the first housing.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Presently disclosed embodiments are directed toward systems and methods for packaging a modular power conversion assembly in a welding power supply. The power conversion assembly may include a first module that includes a portion of a wind tunnel for housing the power magnetic components of an inverter power supply. These magnetic components include one or more transformers for changing a voltage and current of the power flowing through an inductor. The power conversion assembly may include a second module, separate from and coupled to the first module. The second module houses the power electronic components of the inverter power supply. The power supply may be assembled by coupling the two sides of the modular power conversion assembly together, and then inserting the power conversion assembly into the power supply. The modular assembly may allow for individual testing of the first and second modules prior to final assembly of the power supply. In addition, once the power supply is operable, one or both of the modules (e.g., power electronics module) of the power conversion assembly may be readily accessible for replacement without changing out the other module. The modular power conversion assembly of the power supply may allow for relatively easy and flexible assembly, testing, replacement, and removal of the power conversion system components.

Figure 1:
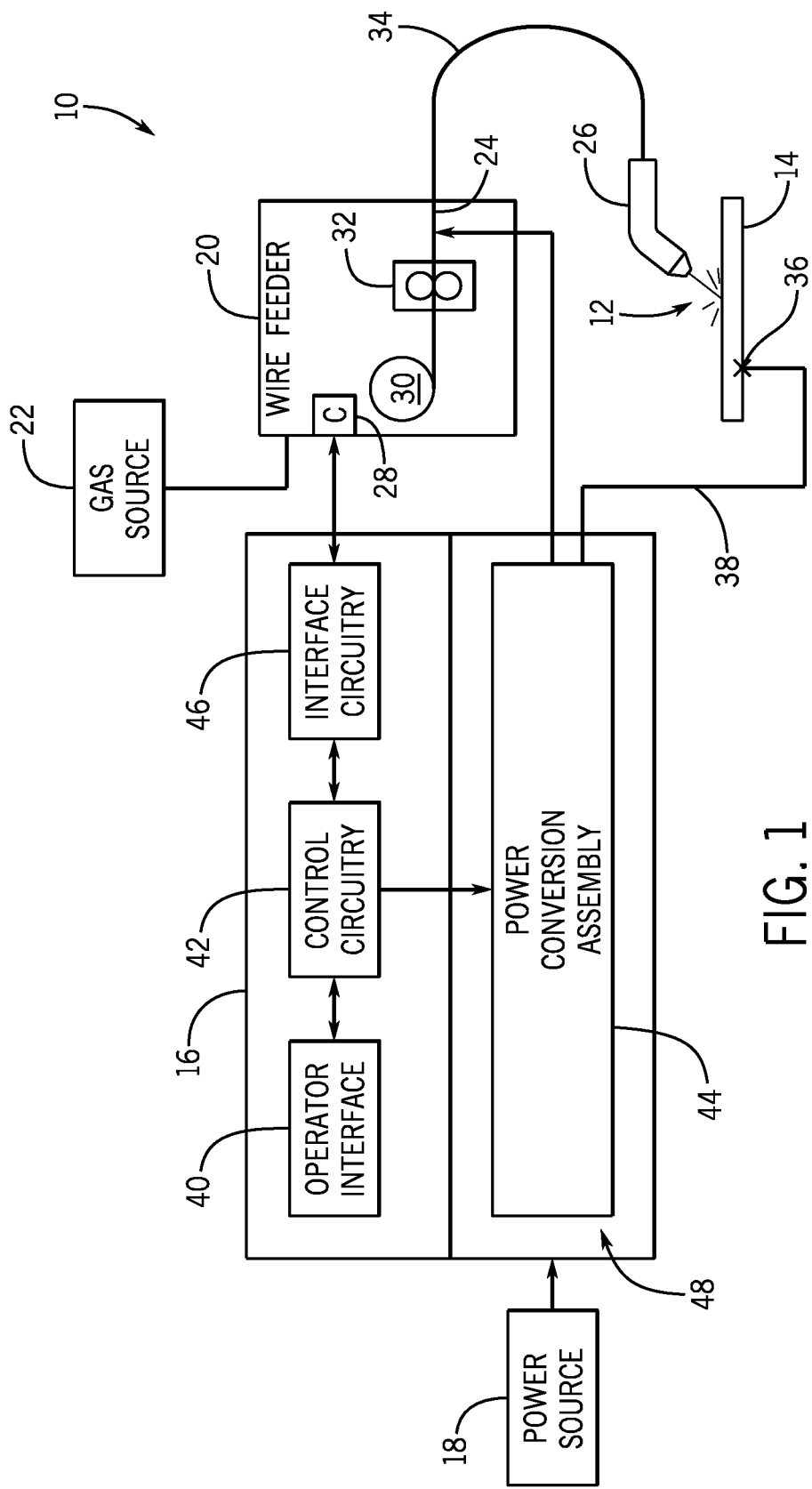
FIG. 1 is a schematic representation of an embodiment of a welding system with a power supply having a modular power conversion assembly.

Turning now to the drawings, FIG. 1 is a schematic diagram of an embodiment of a welding system 10 in accordance with present techniques. The welding system 10 is designed to produce a welding arc 12 at a workpiece 14. The welding arc 12 may form any type of weld, and may be oriented in any desired manner, including gas metal arc welding (GMAW), metal active gas (MAG), various waveforms, tandem setup, and so forth. The welding system 10 includes a power supply 16 that will typically be coupled to a power source 18, such as a power grid. Other power sources 18 may, of course, be utilized including generators, engine-driven power packs, and so forth. In the illustrated embodiment, a wire feeder 20 is coupled to a gas source 22 and the power supply 16, and supplies welding wire 24 to a welding torch 26. The welding wire 24 is fed through the welding torch 26 to the welding arc 12, molten by the welding arc 12, and deposited on the workpiece 14.

The wire feeder 20 will typically include control circuitry 28, which regulates the feed of the welding wire 24 from a spool 30, and commands the output of the power supply 16. The spool 30 will contain a length of welding wire 24 that is consumed during the welding operation. The welding wire 24 is advanced by a wire drive assembly 32, typically through the use of an electric motor under control of the control circuitry 28. The wire drive assembly 32 advances the welding wire 24 through a weld cable 34 leading to the welding torch 26. In addition, the workpiece 14 is coupled to the power supply 16 by a clamp 36 connected to a work cable 38 to complete an electrical circuit when the welding arc 12 is established between the welding torch 26 and the workpiece 14.

Placement of the welding torch 26 at a location proximate to the workpiece 14 allows electrical current, which is provided by the power supply 16 and routed to the welding torch 26, to arc from the welding torch 26 to the workpiece 14. As described above, this arcing completes an electrical circuit that includes the power supply 16, the weld cable 34, the welding torch 26, the workpiece 14, and the work cable 38. Particularly, in certain welding operations, electrical current passes from the power supply 16 through the weld cable 34 to the welding torch 26, to the workpiece 14, and through the work cable 38 back to the power supply 16. In other welding operations, the current flows in the opposite direction. The arcing generates a relatively large amount of heat that causes part of the workpiece 14 and the filler metal of the welding wire 24 to transition to a molten state, thereby forming the weld.

To shield the weld area from being oxidized or contaminated during welding, to enhance arc performance, and to improve the resulting weld, the welding system 10 may also feed an inert shielding gas to the welding torch 26 from the gas source 22. The control circuitry 28 of the wire feeder 20 may regulate the flow of shielding gas to the welding application. It is worth noting, however, that a variety of shielding materials for protecting the weld location may be employed in addition to, or in place of, the inert shielding gas, including active gases and particulate solids.

In the illustrated embodiment, the welding system 10 is designed to allow for data settings to be selected by an operator, particularly via an operator interface 40 provided on the power supply 16. The operator interface 40 may be incorporated into a front faceplate of the power supply 16, and may allow for selection of settings such as the type of weld process, the type of wire to be used, voltage and current settings, and so forth. In particular, the welding system 10 may be designed to allow for GMAW. The selected weld settings are communicated to control circuitry 42 within the power supply 16. The control circuitry 42 operates to control generation of welding power output that is applied to the welding wire 24 for carrying out the desired welding operation. Accordingly, the control circuitry 42 is coupled to power conversion circuitry, which in present embodiments is provided in a power conversion assembly 44 of the power supply 16. This power conversion assembly 44 is configured to create the output power that will ultimately be applied to the welding wire 24 at the welding torch 26. Various power conversion circuits may be employed, including choppers, boost circuitry, buck circuitry, inverters, converters, and so forth. In addition, the power supply 16 illustrated in FIG. 1 includes interface circuitry 46 configured to allow the control circuitry 42 to exchange signals with the control circuitry 28 of the wire feeder 20. In some embodiments, the wire feeder 20 may be incorporated into the power supply 16, in which case the interface circuitry 46 may be omitted. In still further embodiments, however, the wire feeder 20 may not be required, such as for processes such as gas tungsten arc welding (GTAW), commonly known as "TIG" welding, and shielded metal arc welding (SMAW), commonly known as "stick" welding.

In presently disclosed embodiments, the power conversion assembly 44 may be modular. That is, the power conversion assembly 44 may include multiple components that fit together to condition welding power as desired. As noted above, the power conversion assembly 44 may receive control communications from the control circuitry 42. However, in some embodiments, a portion or all of the control circuitry 42 may be located in the power conversion assembly 44. In addition to itself being modular, the power conversion assembly 44 may represent a module of the power supply 16 which is housed in a separate space 48 in the power supply 16 than the other components (e.g., operator interface 40, control circuitry 42, and/or interface circuitry 46). In some embodiments, the power conversion assembly 44 may include a wind tunnel that houses various components of the power conversion circuitry. This wind tunnel may be assembled separately from the rest of the power supply 16, and slid into the designated space 48 in the power supply 16. This space 48 may be configured to receive the power conversion assembly 44 after the power conversion assembly 44 is assembled and tested, or when replacement of the power conversion assembly 44 is desired. As discussed in detail below, the power supply 16 may be configured such that one or more separate sections of the power conversion assembly 44 may be easily removed from the power supply 16 after its initial assembly.

Figure 2:
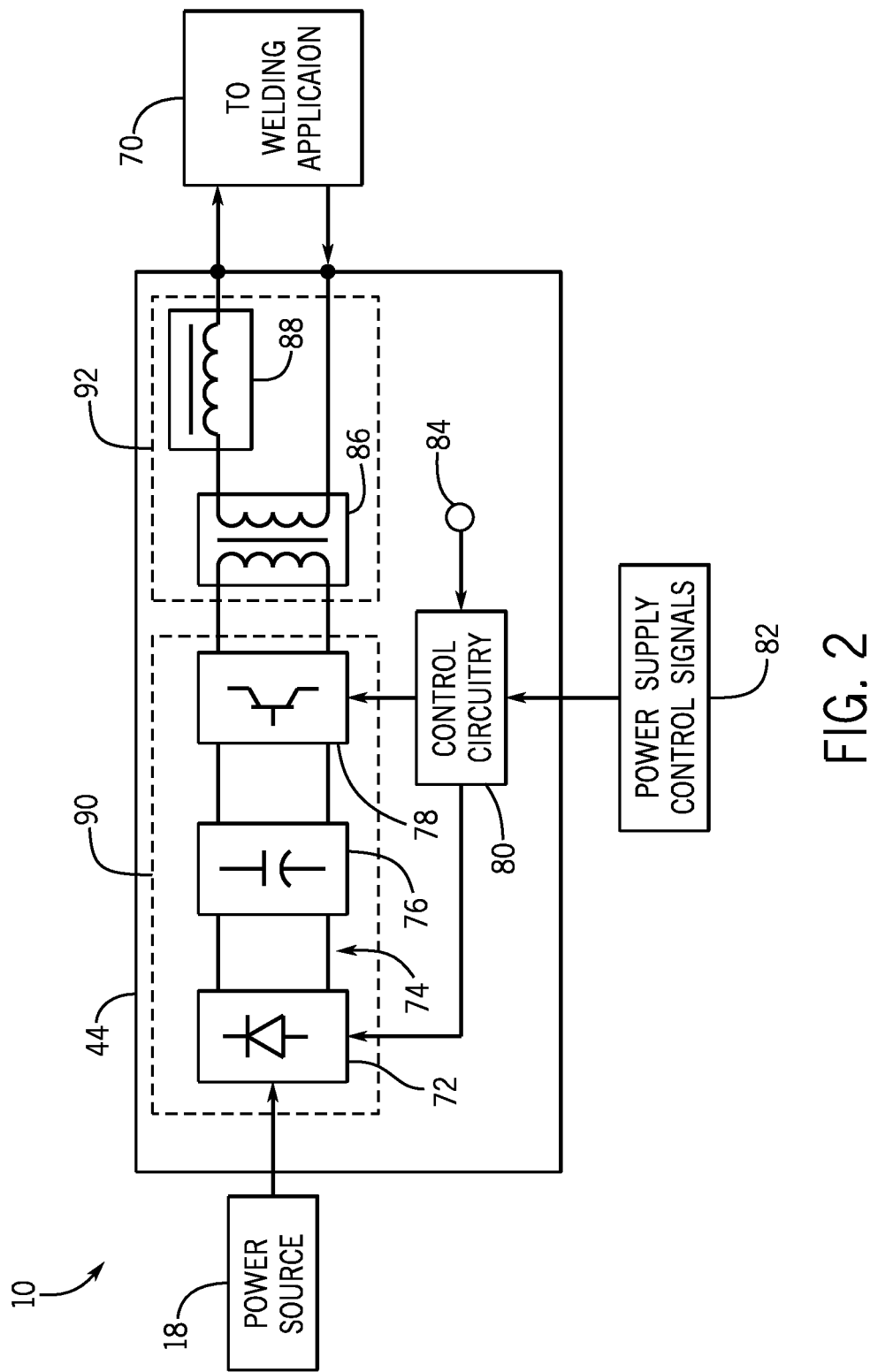
FIG. 2 is a schematic representation of an embodiment of electrical components within the modular power conversion assembly of FIG. 1.

FIG. 2 is a schematic representation of the welding system 10, focusing on the electrical components that make up the power conversion circuitry which may be housed in different sections of the modular power conversion assembly 44. The illustrated power conversion assembly 44 may be used in an inverter power supply or a secondary switching power supply, among others. Such power supplies 16 generally utilize one or more step down transformers for changing the high voltage/low amperage incoming power to low voltage/ high amperage welding power, as well as one or more sections of power switching electronics for precisely controlling the welding power output.

The illustrated embodiment provides one possible assembly of electrical components that may be used to condition incoming power from the power source 18 to welding power appropriate for a welding application 70. The power conversion assembly 44 may include a rectifier 72 to rectify incoming AC primary power into a DC waveform. The rectifier 72 may be a one-phase rectifier or a three-phase rectifier, depending on the phase of the primary power received from the power source 18. The rectifier 72 may include a passive rectifier having a series of diodes that provide a DC waveform to a DC bus 74. Power on the DC bus 74 may be applied to filtering and conditioning circuitry (e.g., filter 76) which help to smooth the waveform, avoiding excessive perturbations in the DC waveform, and so forth.

The DC power may be applied to switching circuitry 78, which may include a series of switches and associated electronic components, such as diodes. In welding applications, particular control regimes may allow for producing pulsed output, AC output, DC output, and other particularly adapted regimes suitable for specific welding processes. Various switching circuitry designs may be employed, and these may use available components, such as insulated gate bipolar transistors (IGBTs), silicon controlled rectifiers (SCRs), and so forth. These may be available in packaging that includes both the switches and/or the diodes in appropriate configurations.

The power conversion assembly 44 may include control circuitry 80 to command the switching circuitry 78 to operate in a way that produces the desired welding power output. In some embodiments, the control circuitry 80 may also control the rectifier 72, such as when the rectifier 72 is an active rectifier. The control circuitry 80 may receive various inputs, such as power supply control signals 82 from the control circuitry 42 of the power supply 16, and feedback from a sensor circuit 84 within the power conversion assembly 44. The sensor circuit 84 may be coupled to an electrical path following the switching circuitry 78. For example, the sensor circuit 84 may detect the power flowing out of the power conversion assembly 44, and the control circuitry 80 may compare the detected power to a desired welding power output commanded by the control circuitry 42. In some embodiments, the control circuitry 42 may be included in the control circuitry 80 of the power conversion assembly 44.

In addition, the power conversion assembly 44 may include a transformer 86 configured to change incoming high voltage/low amperage primary power into low voltage/high amperage welding power. The transformer 86 may include any desirable magnet arrangement, with separate inductive coils wrapped around each leg of the transformer 86. The current flowing through the inductive coil of incoming power may generate a magnetic flux that initiates a current flow through the outgoing inductive coil. The inductive coils and magnetic components of the transformer 86 may be designed to provide an appropriate voltage decrease through the power conversion assembly 44.

Finally, an output inductor 88 may be used for filtering the final output welding power flowing toward the welding application 70. It should be noted that the size and energy storage capacity of the output inductor 88 may be selected to suit the output power (voltage and current) of the anticipated application. Although not illustrated, it should also be noted that certain other circuitry may be provided in this arrangement, and power may be drawn and conditioned in other forms. For example, other embodiments may include different numbers, sequences, and combinations of the illustrated components (e.g., rectifier 72, filter 76, switching circuitry 78, transformer 86, and output inductor 88).

As noted above, the power conversion assembly 44 may include two or more modules that are coupled together to provide the desired power conversion. The electrical components of the power conversion assembly 44 may be separated into these different modules. Specifically, the electrical components may be segregated by material type or function. In some embodiments, all of the power electronics 90 of the power conversion assembly 44 may be located in one module of the power conversion assembly 44, while the power magnetic components 92 (or power magnetics) of the power conversion assembly 44 may be located in another separate module. The power electronics 90 may be coupled with the power magnetics 92 during assembly of the power conversion assembly 44. In general, the power magnetics 92 may include any of the transformers 86 and their associated inductors in the power conversion assembly 44. The power electronics 90 may include diodes, switches, filters, and certain other components (not transformers 86) of the power conversion assembly 44. In the illustrated embodiment, the power electronics 90 include the rectifiers 72, filters 76, and the switching circuitry 78. The power magnetics 92, in the illustrated embodiment, include the transformers 86 and the output inductor 88. However, in other embodiments, the output inductor 88, which functions as a filter for the outgoing welding power, may be considered part of the power electronics 90. The power electronics 90 and the power magnetics 92 may be packaged separately and coupled together to form the modular power conversion assembly 44.

While the following discussion focuses on a modular power conversion assembly 44 with two sections (one for the power electronics 90 and one for the power magnetics 92), it should be noted that other numbers and arrangements of modules may be possible as well. For example, in some embodiments, the control circuitry 80 may be located in a separate section of the power conversion assembly 44 than the power electronics 90 and the power magnetic 92.

Figure 3:
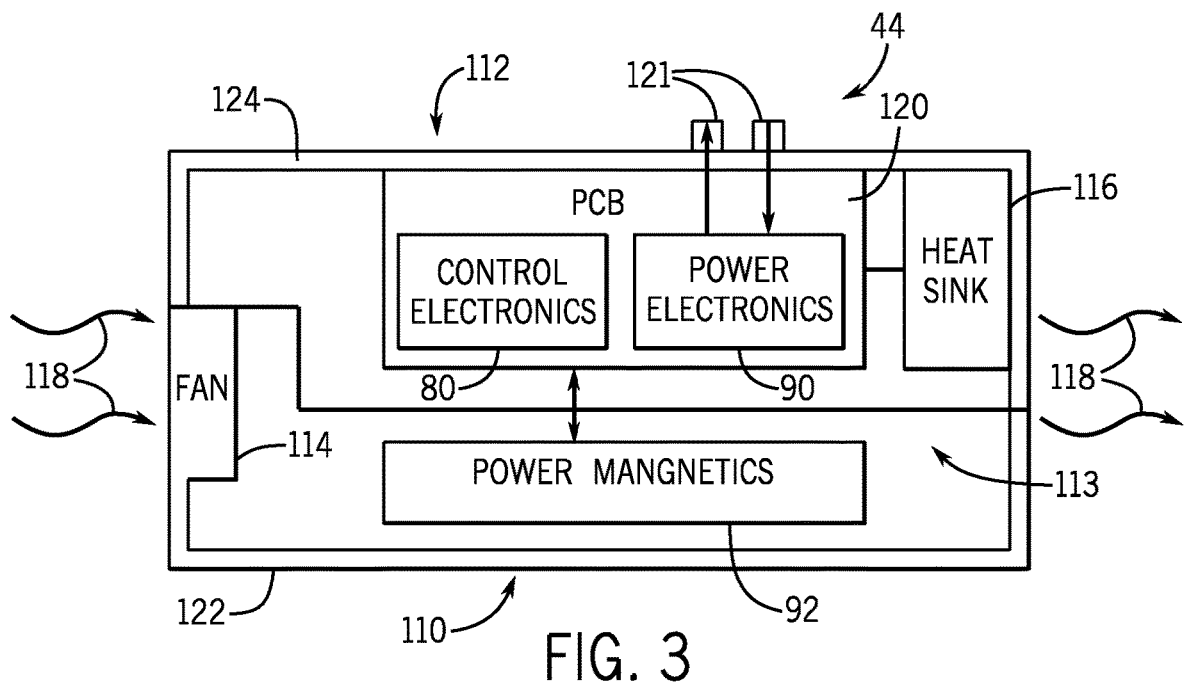
FIG. 3 is a schematic representation of an embodiment of components within two modules of the modular power conversion assembly of FIG. 1.

FIG. 3 is a schematic representation of an embodiment of the power conversion assembly 44. The illustrated embodiment includes two modules 110 and 112 that form a wind tunnel 113. The first module 110 includes the power magnetics 92 and a cooling fan 114. The second module 112 includes the power electronics 90, the control electronics (e.g., control circuitry) 80, and one or more heat sinks 116 for the power electronics 90. The fan 114 may function to draw air from outside the power supply 16 into the wind tunnel 113 and to move the air over the enclosed electrical components to cool the electrical components. The air may exit the power supply 16 at the opposite end of the wind tunnel 113. Air movement through the wind tunnel 113 is shown by arrows 118 in the illustrated embodiment. Although shown in the power magnetics module 110 of the power conversion assembly 44, the fan 114 may be located in other modules (e.g., the power electronics module 112) in other embodiments. The heat sinks 116 may be coupled to the power electronics 90 to provide additional cooling for the switching circuitry 78, which tends to heat up throughout welding operations.

The control electronics 80 and the power electronics 90 may be disposed on one or more printed circuit boards (PCBs) 120 of the power conversion assembly 44. Terminals 121 (e.g., friction terminals) may be coupled to the PCB 120 so that, when the power conversion assembly 44 is complete, cables (e.g., weld cable 34 and work cable 38) may be attached to provide welding power to the welding application 70. The two modules 110 and 112 may be disposed on respective housings 122 and 124. In present embodiments, the term "disposed on" may also refer to the power electronics 90 and the power magnetics 92 being disposed in, or coupled to, the respective housings 124 and 122. The term is not meant to limit the embodiments to those where both the power electronics 90 and the power magnetics 92 are held inside the completed wind tunnel 113.

The housings 122 and 124 may be custom built plastic pieces that fit together to form the wind tunnel 113. During assembly, as described below, the contents of the housing 122 and the housing 124 may be separately assembled and tested. Then, the housings 122 and 124 may be coupled (e.g., snapped together), and any necessary electrical connections may be made between the power electronics 90 and the power magnetics 92. Upon completing this assembly, the power conversion assembly 44 may be tested again. In this way, the power conversion assembly 44 may include fully operational power conversion circuitry contained within a relatively sturdy shell. As noted above, the wind tunnel 113 (along with the assembled internal components) may be slid into the space 48 within the power supply 16. However, even after the entire power supply 16 is assembled, one or more of the modules 110 and 112 of the power conversion assembly 44 may be removed from the power supply 16. This may facilitate relatively simple onsite repairs or replacements of certain components of the power supply 16.

Figure 4:
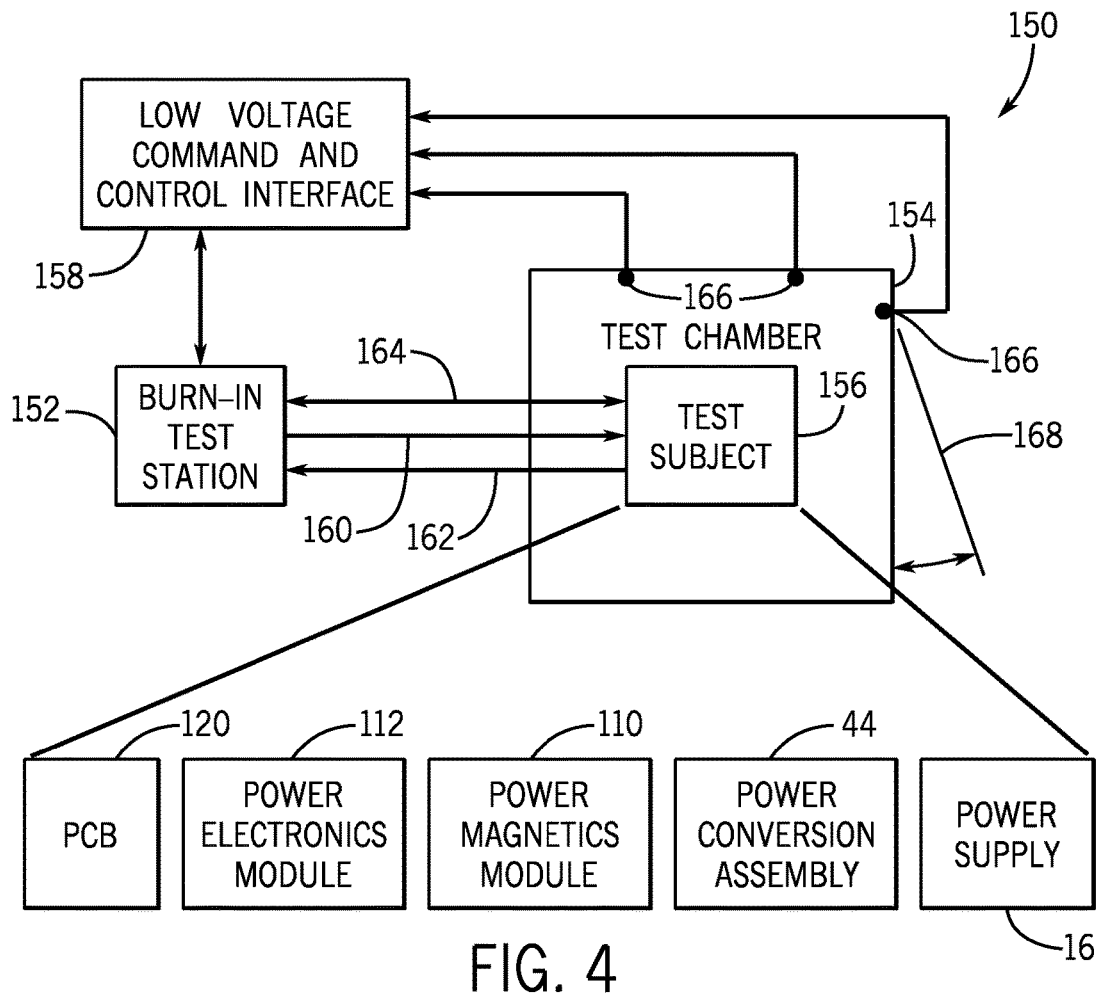
FIG. 4 is a schematic representation of an embodiment of a burn-in test system that may be used to test the modular power conversion assembly of FIG. 1.

FIG. 4 is a schematic representation of an embodiment of a test system 150 that may be used to test one or more components of the modular power supply 16. The test system 150 may include a burn-in test station 152, a test chamber 154 for receiving a test subject 156, and a low voltage command and control interface 158. The test system 150 may be used to perform burn-in tests to maximally stress the test subject 156 in a relatively short amount of time. That is, the test system 150 may stress the test subject 156 to its maximum rated operation for a period of time, while monitoring the condition and response of the test subject 156. By performing this sort of test, the test system 150 may be able to identify any operational inefficiencies with the test subject 156 before the test subject 156 is sent out for use in a welding operation.

Due to the modularity of the power supply 16 and the power conversion assembly 44, the same test system 150 may be used to individually test any number of different components and subcomponents that are assembled together to make the power supply 16. For example, as illustrated, the test subject 156 may include the PCB 120, the power electronics module 112, the power magnetics module 110, the power conversion assembly 44, or the power supply 16 as a whole. In addition, these components of the power supply 16 may be tested at each level during the assembly of the power supply 16. That is, once the PCB 120 functions well in the test system 150, the PCB may be assembled into the power electronics module 112, and the power electronics module 112 may be tested in the test system 150. The test system 150 may be used to test the power magnetics module 110, and then the power electronics module 112 and the power magnetics module 110 may be assembled into the power conversion assembly 44 for additional testing. Finally, the power conversion assembly 44 may be inserted into and connected to the power supply 16 for entire system testing. This progression of tests may provide general information as to which portion of the power supply 16 is not operating as desired. This may help to streamline any rework or further testing of the power supply 16, as compared to a single test performed on the entire assembled power supply 16.

During testing, the test subject 156 may be electrically coupled to the burn-in test station 152. In the illustrated embodiment, the burn-in test station 152 is attached to the test subject 156 via three different connections, although any desirable number of connections may be used. These connections may include, for example, a primary power connection 160, a weld power output connection 162, and a digital communication connection 164. The primary power connection 160 provides input power from the burn-in test station 152 to the test subject 156, and this input power is appropriate for stressing the test subject 156 that is currently in the test chamber 154. The weld power output connection 162 may provide the power output from the test subject 156 to the burn-in test station 152. The digital communication connection 164 may provide communication between the burn-in test station 152 and the test subject 156 throughout the testing. The digital communications connection 164 may be wired or wireless, depending on the capabilities of the test subject 156 and the burn-in test station 152. The primary power connection 160 and the weld power output connection 162, together, may be used to exercise the power electronics (e.g., 90) of the test subject 156, and the digital communication connection 164 may be used to exercise the digital control components of the test subject 156.

The burn-in test station 152 may receive commands from the low voltage command and control interface 158 to provide the desired power and communications over the respective connections 160 and 164. The low voltage command and control interface 158 may be part of the burn-in test station 152, and may contain any desirable number of processors, in addition to memory components for storing routines and other code executable by the processors. The low voltage command and control interface 158 may receive feedback from the test subject 156 relating to operation of the digital control components of the test subject 156. The low voltage command and control interface 158 may be in communication with the test chamber 154 as well, in some embodiments.

The test subject 156 may be placed into the test chamber 154 during testing. The test chamber 154 may include all necessary connections (e.g., 160, 162, and 164) to interface the burn-in test station 152 with the test subject 156. In some embodiments, the test chamber 154 may be fitted with sensors 166 to provide various sensor data to the low voltage command and control interface 158. For example, the test chamber 154 may include temperature and/or humidity sensors to confirm that the test subject 156 is operating within expected parameters. The test chamber 154 may also include lockout features. For example, a sensor 166 may be located near a door 168 to the test chamber 154 to ensure that the door 168 is closed prior to beginning a test. When data from the sensors 166 indicates that the door 168 is open (or that the test chamber 154 is otherwise not ready for testing), the low voltage command and control interface 158 may signal the burn-in test station 152 to not provide primary power to the test subject 156.

The burn-in test station 152 may command the test subject 156 to perform a predetermined set of operations. This testing may be performed based on what test subject 156 is hooked up to the burn-in test station 152. That is, different commands may be provided for different types and/or power ratings of test subjects 156. In some embodiments, the test subject 156 may communicate what type of component it is to the burn-in test station 152 via the digital communication connection 164. That is, the test subject 156 may output information to the burn-in test station 152 relating to its component type (e.g., power supply 16, power conversion assembly 44, power magnetics module 110, power electronics module 112, or PCB 120) and/or relating to its power rating. Based on these signals from the test subject 156, the burn-in test station 152 may command the test subject 156 to perform certain operations based on the type of component it is and/or based on its power rating. In other embodiments, the burn-in test station 152 may command the test subject 156 to perform the set of predetermined operations based on signals received from an operator, such as those communicated via an operator interface of the low voltage command and control interface 158.

To perform one of the predetermined tests, the burn-in test station 152 may communicate with the control features of the test subject 156 (via the digital communication connection 164) to control the test subject 156 as desired for a particular test. For example, the burn-in test station 152 may command the test subject 156 to operate within each of the various control regimes that are possible with the particular test subject 156. The low voltage command and control interface 158 may also command the burn-in test station 152 to provide an appropriate amount of primary power for the test subject 156. For example, when testing the power conversion assembly 44 or the power supply 16, the burn-in test station 152 may be commanded to output expected primary power of approximately 120 V or 240 V. The low voltage command and control interface 158 may determine, based on the output power received through the weld power output connection 162, if the test subject 156 is operating as desired.

Using the low voltage command and control interface 158, the test system 150 may facilitate improved diagnostics of the test subject 156. That is, a larger variety of tests may be available for the test subject 156. In addition, the test system 150 may receive more information as to when, where, and how inefficiencies occur during testing. This may focus the efforts put into rework of the test subject 156.

The illustrated test system 150 may be capable of testing all of the different test subjects 156 that make up the power supply 16. However, in other embodiments, multiple different test systems 150 may be used to perform the testing of the modular components of the power supply 16. After completion of testing of the various components of the power supply 16 (and their subcomponents), the power supply 16 may be assembled and provided for use in the field.

Figure 5:
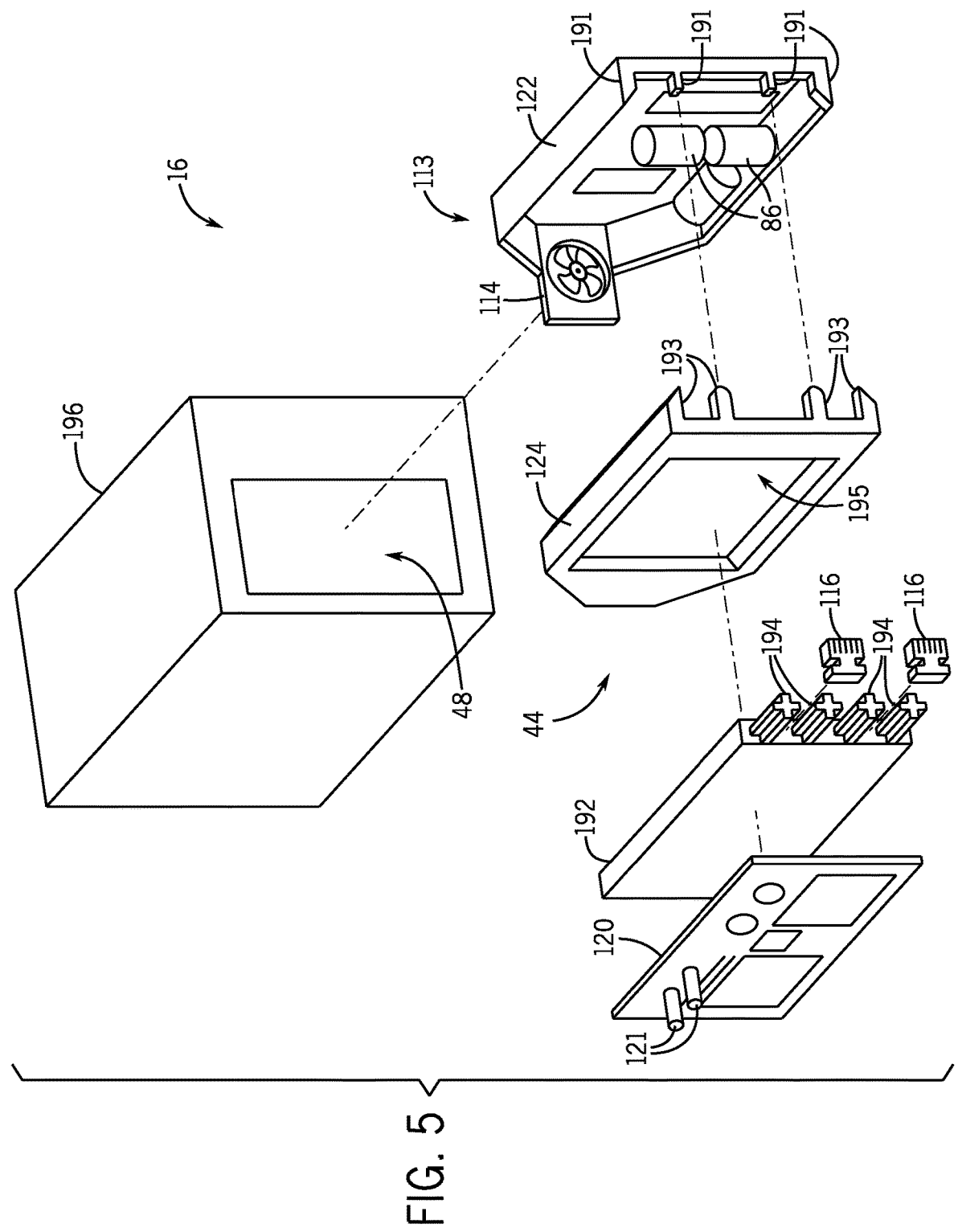
FIG. 5 is an exploded perspective view of an embodiment of the modular power conversion assembly of FIG. 1.

FIG. 5 is an exploded perspective view of an embodiment of the modular power supply 16. The illustrated embodiment shows one possible arrangement and way to assemble the power conversion assembly 44, as well as the entire power supply 16. The power supply 16 has been simplified to focus on a spatial arrangement of the components that make up the power supply 16, and these components may be assembled as described below. The power conversion assembly 44 may include the two housings 122 and 124 that make up the wind tunnel 113, the power magnetics 92 (e.g., transformer 86), the heat sink 116 for dissipating heat from the power electronics 90 on the PCB 120, and a heat sink frame 192 that holds the PCB 120 in place near the one or more heat sinks 116. The heat sink frame 192 generally operates as a PCB carrier in the present application, since it is configured to hold the PCB 120.

In some embodiments, the power magnetics module 110 may be assembled first. That is, the housing 122 may be obtained or constructed, and the power magnetics 92 (e.g., transformer 86) may be secured within the housing 122. This assembly may be accomplished using screws, nuts, and/or other types of fasteners. After the power magnetics module 110 is assembled, the housing 124 (e.g., the next complementary piece of the wind tunnel 113) may be attached to the housing 122 to complete the wind tunnel 113. The housings 122 and 124 may include mating components 191 and 193, respectively. The mating components 191 and 193 may be configured to mate with each other to secure the two housings 122 and 124 together. Such mating components 191 and 193 may include a lip, tongue, groove, pin, or other overlapping feature that allows the housings 122 and 124 to be coupled to one another. In some embodiments, the housings 122 and 124 may be abutted axially and secured together with a separate fastener component. Screws or other fasteners may be placed through overlapping sections of the housings 122 and 124, thereby securing them together. Other methods and arrangements of housing components and fasteners may be used to form the wind tunnel 113.

The power electronics module 112 may be assembled through an opening 195 into the fully constructed wind tunnel 113. In the illustrated embodiment, the heat sinks 116 may be inserted onto the heat sink frame 192. The heat sink frame 192 may include mounting features for mounting the heat sinks 116 onto the heat sink frame 192 such that the heat sinks 116 extend into the air flow path of the fan 114. As illustrated, for example, the heat sink frame 192 may include precisely designed tongue and groove holders 194 to receive the heat sinks 116. That is, the heat sinks 116 may be slid into the heat sink frame 192 at a particular location via the tongue and groove holders 194. The heat sinks 116 may receive heat from the power electronics 90 on the PCB 120 and transfer the heat to the air blowing over the heat sinks 116 in the wind tunnel 113. Although the PCB 120 is disposed on an outer edge of the heat sink frame 192 not facing the interior of the wind tunnel 113, the heat sinks 116 may extend into the wind tunnel 113.

Other types of holders and mechanisms may be used to receive and position the heat sink 116 precisely relative to the PCB 120. For example, in some embodiments, the housing 124 may be configured with the tongue and groove holders 194 for receiving the heat sinks 116, while the heat sink frame 192 may function as a PCB carrier to hold the PCB 120 in position relative to the heat sinks 116.

After the heat sinks 116 are in place, the PCB 120 may be added to the heat sink frame 192. One or more PCBs 120 may include the power electronics 90 and the control electronics 80. The one or more PCBs 120 may be attached to the heat sink frame 192 with screws and heat sink clips (not shown). The heat sink frame 192, with the PCB 120 and the heat sinks 116 attached thereto, may function as the completed power electronics module 112, in some embodiments.

The heat sink frame 192 may be easily attached to the wind tunnel 113 (more specifically, the housing 124) during assembly. In some embodiments, the heat sink frame 192 may be relatively sturdy so that it can be assembled and shipped to a distant locale (e.g., for servicing a power supply 16 away from the shop). The heat sink frame 192 may be attachable to the housing 122 of the power magnetics module 110 via any number or type of fastener features. In some embodiments, the heat sink frame 192 may be attached to the power magnetics module 110 using relatively simple plastic fastening features, making this process effectively tool-less. This may facilitate relatively easy attachment and removal of the heat sink frame 192. Screws may be used to securely attach the two halves (power magnetics module 110 and power electronics module 112) as well. Finally, the assembly may be completed via an addition of the friction terminals 121 to the PCB 120. This may be performed before or after the PCB 120 is secured within the wind tunnel 113.

The wind tunnel 113 (including the interior components of the power conversion assembly 44) may slide into the opening (e.g., space 48) of a base or chassis 196 of the power supply 16. The power conversion assembly 44 may include a removal mechanism that facilitates relatively easy removal of the power conversion assembly 44 from the power supply 16. Specifically, for example, the power conversion assembly 44 may be configured with rails or some other feature for sliding into and out of the chassis 196 of the power supply 16. In other embodiments, the power conversion assembly 44 may be disposed within the chassis 196 and secured in place via a set screw. Upon removal of this set screw, the power conversion assembly 44 may be removed from the power supply 16 through the opening in the chassis 196. The power conversion assembly 44 may be removed from the chassis 196 if desired, such as during replacement or servicing of the entire power conversion assembly 44. In other embodiments, just a portion of the power conversion assembly 44 may be removable from the fully assembled power supply 16.

In some embodiments, the wind tunnel 113 may be configured to remain in the power supply 16 after its initial assembly. In such cases, one or more modules of the power conversion assembly 44 may be removable from the relatively stationary wind tunnel 113. In addition, the wind tunnel 113 may be coupled to certain components of the power conversion assembly 44 that have relatively low replacement rates. A replacement rate represents the rate at which a particular component may need to be replaced during use of the power supply 16. For example, the power magnetics 92 (e.g., transformer 86) may have a relatively low replacement rate, and so may be securely fastened within the wind tunnel 113. However, the power electronics 90 and/or control electronics 80 may be configured to easily slide out of the wind tunnel 113 (e.g., via the heat sink frame 192) for updating, replacing, retesting, or removing the electronic components. That is, the components that are more often switched out of the power supply 16 (e.g., power electronics 90 and control electronics 80) may be easily removable from the rest of the power supply 16, without removing the components (e.g., power magnetics 92) with a higher reliability. The higher reliability side in the wind tunnel 113 may include a relatively high amount of copper (e.g., inductor windings of the transformer 86). Thus, the power conversion assembly 44 may receive new power electronics 90 in a packaged manner without having to replace many of the copper components already installed in the power conversion assembly 44.

Figure 6:
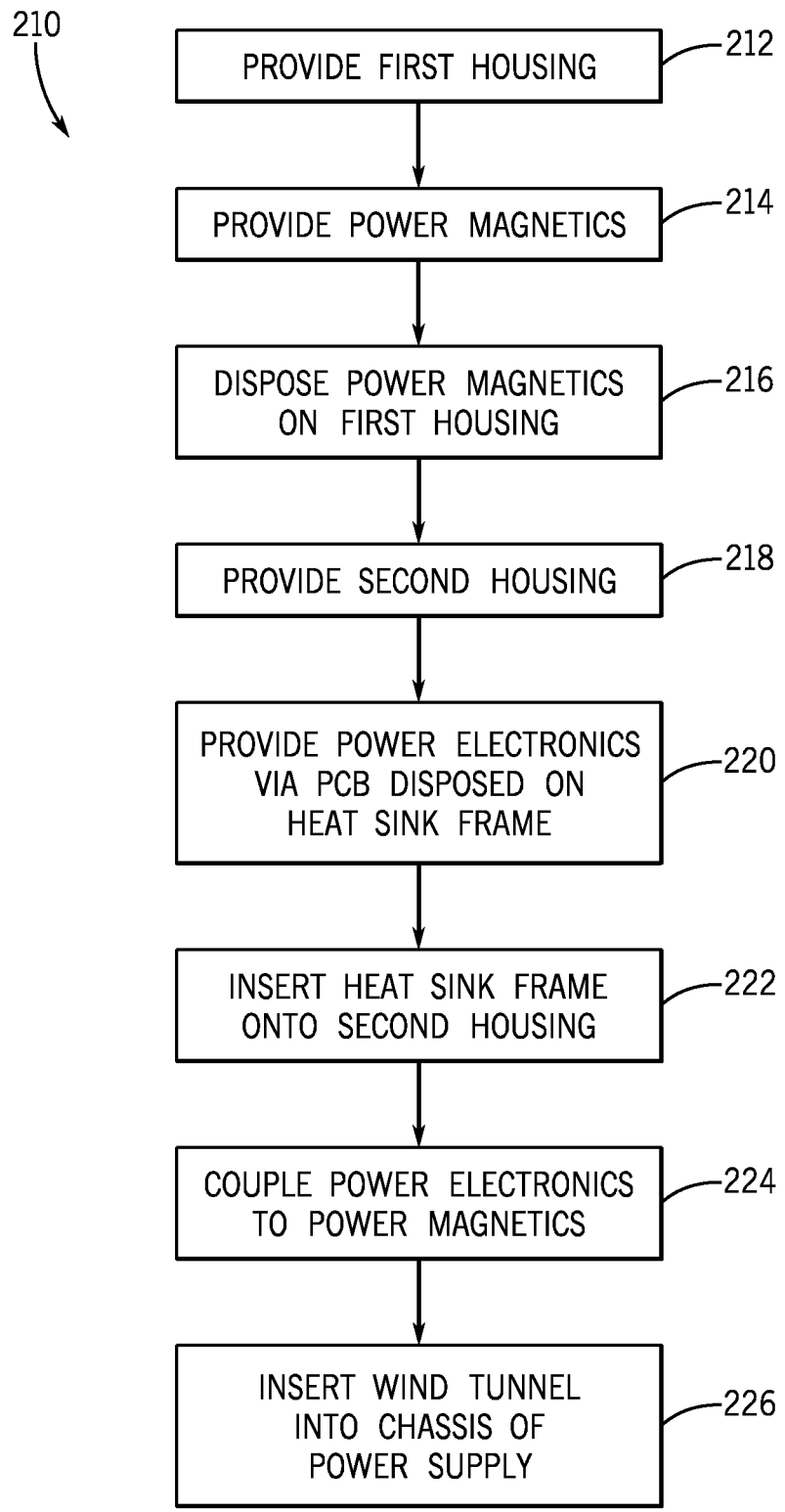
FIG. 6 is a process flow diagram of an embodiment of a method for assembling the modular power conversion assembly of FIG. 1.

FIG. 6 is a process flow diagram of a method 210 for assembling the power supply 16. The method 210 includes providing (block 212) a first housing (e.g., housing 122) of the power conversion assembly 44. The method 210 also includes providing (block 214) the power magnetics 92. The method 210 may include disposing (block 216) the power magnetics 92 on the first housing 122. In addition, the method 210 includes providing (block 218) a second housing (e.g., housing 124) coupled to the first housing 122 to form the wind tunnel 113 of the power supply 16. Further, the method 210 includes providing the power electronics 90 of the power conversion assembly 44, and disposing the power electronics 90 on the second housing 124. In the illustrated embodiment, this may involve providing (block 220) the power electronics 90 via the PCB 120 disposed on the heat sink frame 192, and inserting (block 222) the heat sink frame 192 onto the second housing 124. The method 210 also includes coupling (block 224) the power electronics 90 to the power magnetics 92 via leads or other wired connections. In addition, the method 210 may include inserting (block 226) the wind tunnel 113 (e.g., first housing 122 coupled to the second housing 124) into the chassis 196 of the power supply 16, as described above. It should be noted that the testing procedure described above with respect to FIG. 4 may be performed on individual components that make up the power supply 16 at (or prior to) any step of the method 210.

Figure 7:
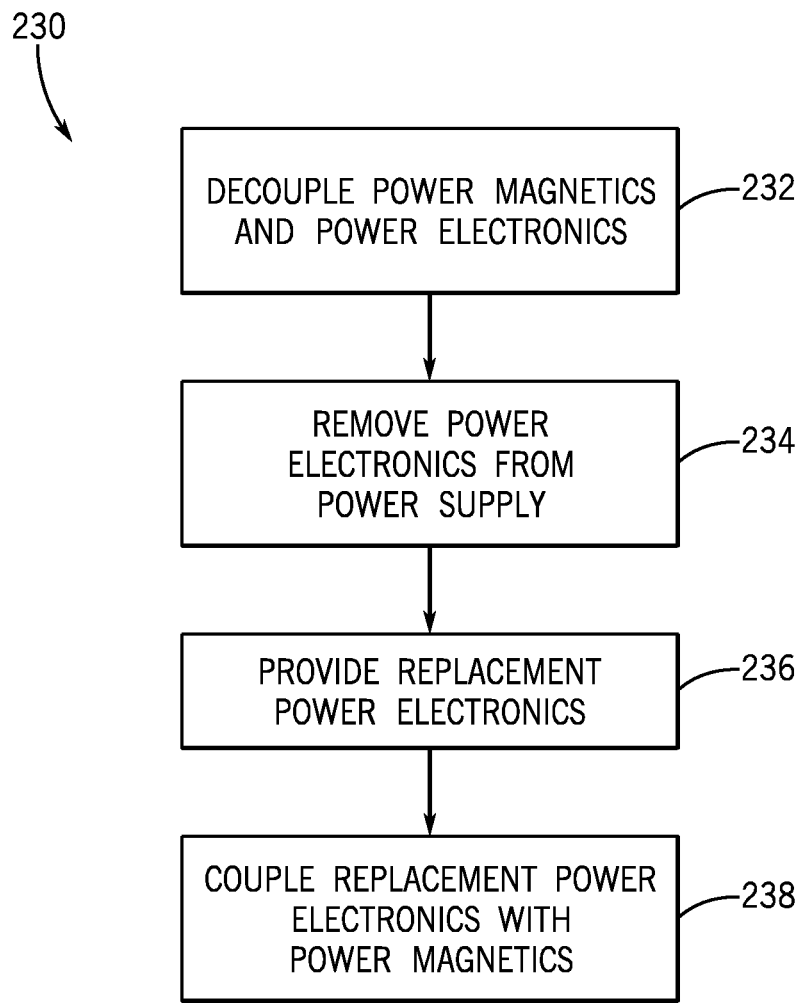
FIG. 7 is a process flow diagram of an embodiment of a method for replacing a module of the modular power conversion assembly of FIG. 1.

In addition to the method 210 for initially assembling the power supply 16, there may be ways to replace certain components of the power supply 16 after the power supply 16 is initially assembled and sent out for use in the field. For example, FIG. 7 is a process flow diagram of a method 230 for replacing the power electronics 90 of the power supply 16. This may be particularly desirable at times when the power supply 16 is no longer operating to provide the desired weld power output. In such cases, the power electronics 90 (e.g., located on PCB 120) may be removed for additional testing and/or replacement without disturbing other components of the power supply 16. The method 230 includes decoupling (block 232) the power magnetics 92 and the power electronics 90, and removing (block 234) the power electronics 90 from the power supply 16 without removing the power magnetics 92. As noted above, this may involve detaching and removing the heat sink frame 192 from the power supply 16 (and away from the wind tunnel 113) through an opening in the chassis 196 of the power supply 16. In some embodiments, the chassis 196 may be equipped with a door or opening to provide easy access to the heat sink frame 192 for removal of the power electronics 90.

The method 230 further includes providing (block 236) replacement power electronics for disposal in the second housing 124, and coupling (block 238) the replacement power electronics with the power magnetics 92 located in the first housing 122. In this way, only the power electronics 90 may be replaced during servicing of the power supply 16. In the event that the power magnetics 92 and/or other components located in the first housing 122 need to be replaced, the entire wind tunnel 113 may be removed and reassembled with a new power magnetic module 110.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power conversion assembly used in combination with a welding power supply, comprising:
   a power magnetics module comprising at least one transformer disposed on a first wind tunnel housing; and
   a power electronics module that is separate from and configured to be electrically coupled to the power magnetics module, wherein the power electronics module and the power magnetics module are configured to convert input power to welding power, wherein the power electronics module comprises switching circuitry and one or more heat sinks to remove heat from the switching circuitry, wherein the switching circuitry and the heat sinks are disposed on a second wind tunnel housing configured to be attached to the first wind tunnel housing, wherein parallel sides of the first wind tunnel housing and the second wind tunnel housing are configured to be removably attached together to form an integrated wind tunnel between the parallel sides of the first wind tunnel housing and the second wind tunnel housing;
   wherein the power electronics module is configured to be removed from the welding power supply with the integrated wind tunnel by sliding the power electronics module, the first wind tunnel housing, and the second wind tunnel housing as a single assembly through an opening formed in a sidewall of a chassis of the welding power supply along a lengthwise direction of the parallel sides.

2. The power conversion assembly of claim 1, comprising a removal mechanism that facilitates removal of the power conversion assembly from the welding power supply.

3. The power conversion assembly of claim 1, wherein the power magnetics module comprises a fan for cooling the power conversion assembly.

4. The power conversion assembly of claim 3, wherein the fan is configured to move air through the power magnetics module and the power electronics module for cooling both the power magnetics module and the power electronics module.

5. The power conversion assembly of claim 3, wherein the second wind tunnel housing comprises a mounting feature configured to mount the heat sinks to the second wind tunnel housing such that the heat sinks extend into an air flow path of the fan.

6. The power conversion assembly of claim 1, wherein the switching circuitry is disposed on one or more printed circuit boards (PCBs), and wherein the one or more PCBs are mounted on a PCB carrier of the power electronics module.

7. The power conversion assembly of claim 6, wherein the PCB carrier is configured to be removable from the power conversion assembly while the power conversion assembly is installed in the welding power supply.

8. The power conversion assembly of claim 1, wherein the first wind tunnel housing and the second wind tunnel housing each comprise mating components configured to mate with each other to secure the first wind tunnel housing and the second wind tunnel housing together.

9. The power conversion assembly of claim 1, comprising one or more rails coupled to the chassis and the power electronics module, wherein the one or more rails are configured to enable the power electronics module and the integrated wind tunnel to slide along the one or more rails to remove the power electronics module and the integrated wind tunnel through the opening.

10. The power conversion assembly of claim 1, comprising one or more set screws configured to couple the power electronics module to the chassis, wherein removal of the one or more set screws enables removal of the power electronics module through the opening.

11. The power conversion assembly of claim 1, wherein the power magnetics module and the power electronics module are configured to output welding power.

12. A power conversion assembly used in combination with a welding power supply having a chassis that is assembled to define an opening in a sidewall of the chassis, comprising:
- an integrated wind tunnel having a first wind tunnel housing and a second wind tunnel housing, wherein parallel sides of the first wind tunnel housing and the second wind tunnel housing are configured to be removably attached together along a lengthwise direction to form the integrated wind tunnel between the parallel sides,
- a power magnetics module comprising at least one transformer disposed on the first wind tunnel housing; and
- a power electronics module that is separate from and configured to be electrically coupled to the power magnetics module to convert input power to welding power,
  - wherein the power electronics module comprises, disposed on the second wind tunnel housing, switching circuitry and one or more heat sinks to dissipate heat from the switching circuitry,
- wherein the power electronics module and the integrated wind tunnel are configured to be removed from the welding power supply by sliding both the integrated wind tunnel and the power electronics module through the opening of the chassis along the lengthwise direction.

13. The power conversion assembly of claim 12, wherein the chassis comprises a door or removable panel over the opening to provide easy access.

14. The power conversion assembly of claim 12, comprising one or more rails coupled to the chassis and the power electronics module, wherein the one or more rails are configured to enable the power electronics module and the integrated wind tunnel to slide along the one or more rails to remove the power electronics module and the integrated wind tunnel through the opening.

15. The power conversion assembly of claim 12, wherein the power magnetics module comprises a fan positioned at an end of the integrated wind tunnel and configured to cool the power conversion assembly.

* * * * *